United States Patent
Schulz et al.

(10) Patent No.: US 7,205,777 B2
(45) Date of Patent: Apr. 17, 2007

(54) CAPACITIVE PROXIMITY SWITCH

(75) Inventors: Joerg Schulz, Lustenau (AT); Gerhard Heilig, Waldburg (DE); Heidrun Richter, Wertingen (DE); Bernd Steegmann, Heiligenhaus (DE); Martin Witte, Ahaus (DE); Gianni Uselli, Velbert (DE)

(73) Assignees: i f m electronic GmbH, Essen (DE); Huf Huelsbeck & Fuerst GmbH & Co., KG, Veldbert (DE)

( * ) Notice: Subject to any disclaimer, the term of this patent is extended or adjusted under 35 U.S.C. 154(b) by 390 days.

(21) Appl. No.: 10/913,498

(22) Filed: Aug. 9, 2004

(65) Prior Publication Data

US 2005/0068712 A1   Mar. 31, 2005

(30) Foreign Application Priority Data

Aug. 8, 2003 (DE) ............................... 103 36 335

(51) Int. Cl.
*G01R 27/26* (2006.01)
*B60L 3/00* (2006.01)
*B60R 25/10* (2006.01)
*G08B 21/00* (2006.01)

(52) U.S. Cl. ..................... 324/661; 307/10.1; 307/652; 340/426.28; 340/686.6

(58) Field of Classification Search ................ 324/662, 324/661, 658, 649, 600, 671, 686, 699, 635, 324/644, 678, 679, 672; 307/109, 142, 652, 307/10.1; 340/541, 562, 426.28, 686.6; 327/517
See application file for complete search history.

(56) References Cited

U.S. PATENT DOCUMENTS

| 3,723,885 | A | * | 3/1973 | Urmenyi | ..................... 307/652 |
| 5,880,538 | A | | 3/1999 | Schulz | |
| 6,075,294 | A | | 6/2000 | Van den Boom et al. | |
| 6,194,903 | B1 | * | 2/2001 | Schulz | ...................... 324/661 |
| 6,377,009 | B1 | * | 4/2002 | Philipp | ....................... 318/468 |
| 6,429,782 | B2 | * | 8/2002 | Pavatich et al. | .......... 340/686.6 |
| 7,126,453 | B2 | * | 10/2006 | Sandau et al. | ............. 340/5.61 |
| 2002/0149262 | A1 | * | 10/2002 | Weyerstall et al. | ........ 307/10.1 |
| 2004/0046449 | A1 | * | 3/2004 | Eideheim et al. | .......... 307/10.1 |
| 2004/0125545 | A1 | * | 7/2004 | Kobayashi et al. | ......... 361/600 |

* cited by examiner

*Primary Examiner*—Andrew H. Hirshfeld
*Assistant Examiner*—Hoai-An D. Nguyen
(74) *Attorney, Agent, or Firm*—David S. Safran

(57) ABSTRACT

A capacitive proximity switch for detecting the change in the capacitance relative to a setpoint capacitance by the approach or retreat of an object in the sensitive area of a proximity switch, especially for use in the door handle of a motor vehicle, provides reliable error detection and error suppression at a fundamentally high sensitivity of the capacitive proximity switch by utilizing an evaluation unit that evaluates a measured value of the change in capacitance over time and depending on the time behavior of the measured value activates changes the operating threshold from a first threshold (which can be caused by a false object coming into or out of the sensitive area of the proximity switch) to a higher second threshold which can be reached only at a relatively greater change in capacitance caused by a target object coming into or out of the sensitive area of the proximity switch.

18 Claims, 7 Drawing Sheets

CAPACITIVE PROXIMITY SWITCH

BACKGROUND OF THE INVENTION

1. Field of the Invention

The invention relates to a capacitive proximity switch for detecting the change in the capacitance relative to a setpoint capacitance $C_{set}$ by the approach or retreat of an object in the sensitive area of a proximity switch, especially for use in the door handle of a motor vehicle, with an electrode system which has at least one response electrode and with a switching output, the measured value which corresponds to the change in capacitance being compared to an operating threshold $S_1$ and at the switching output a switching signal being produced depending on the measured value.

2. Description of Related Art

As is recognized, capacitive proximity switches respond when the capacitance between the response electrode and a reference electrode reaches or exceeds a certain value, specifically because the response electrode approaches an object which for its part is galvanically or capacitively connected to the reference electrode. Often the frame or ground potential acts as a reference electrode. Here, the capacitive proximity switch detects the change of capacitance relative to a setpoint capacitance and produces a corresponding measured value. However, since generally such a small change of capacitance is not designed to lead to an output signal, the measured value is compared to an operating threshold $S_1$ so that only then is an output signal, i.e., a switching signal, produced when the change in capacitance or the corresponding measured value is larger than the operating threshold.

The measured value can be, for example, a voltage. However, the measured value can also be other quantities which are used as a measure for the change in the capacitance. For example, the measured value can be a number of clocked discharge processes of a reference capacitor or a discharge interval. Then, a quantity is chosen as the operating threshold which corresponds to the quantity which forms the measured value; i.e. a voltage, a number discharges or a discharge interval.

Often, the presence of a certain object is to be detected with the capacitive proximity switch. Then the problem can arise that a change in capacitance is measured which is greater than the operating threshold, but does not originate from the object which is actually monitored—the target object—but from another object—a false object.

This problem can, in any case, theoretically be solved by the operating threshold being set so high that the probability is very low that a change in capacitance which has been caused by a false object or the corresponding measured value is greater than the operating threshold. This measure can suppress most of the possible errors, but the choice of a high operating threshold, however, clearly reduces the sensitivity of the capacitive proximity switch at the same time.

Although this invention can be used quite generally in any capacitive proximity switch in which both high sensitivity and also good noise suppression are desirable, the invention is described below, without being limited to a specific application example, is described specifically relative to a capacitive proximity switch which is used in the door handle of a motor vehicle and serves there for unlocking and locking the door lock.

The advantage of the use of a capacitive proximity switch to unlock (or also to lock) the door handle of a motor vehicle consists in that the desired actuation is necessary, but it is sufficient when the individual approaches the sensitive area of the motor vehicle in a purposeful manner. Of course, the door handle of the measured value is the sensitive area. (When it is a matter of locking or unlocking the trunk of a measured value, the sensitive area for dedicated actuation can also be the actuating handle on the trunk lid. The expression door handle is always used below. Everything which is described in conjunction with the expression door handle of course also applies with reference to the actuating handle on the trunk lid).

From the early days of the motor vehicles through the 1970s, the vehicle owner had hardly any other possibility than locking or unlocking and opening his motor vehicle with a mechanical key. Due to the increasing use of electronics in motor vehicles in the 1980s, centralized locking and unlocking, and afterwards, remote controls began to increasingly appear in motor vehicles. In North America, radio remote controls, and in Europe, infrared remote controls predominate. For some years, a so-called smart card system has been known (see, "Siemens-Zeitschrift", 1/96, pages 32–35) in which in the motor vehicle there is an identification receiver. To gain access to the motor vehicle, i.e., especially to lock and unlock the door lock, the individual must carry an identification sender. Since the identification sender has the shape and size of a credit card, it is very easy for the individual to carry this card. By an authorization query proceeding from the identification receiver to the identification sender, the individual who is carrying the identification sender can be identified as an "authorized" individual.

If, at this point, the response electrode of the capacitive proximity switch is on the door handle or integrated into the door handle, as is known, for example, from German Patent Application DE 196 17 038 A1, it can happen that external effects can lead to the capacitive proximity switch triggering in an unwanted manner—for example, by rain, snow or ice allowing the capacitance between the response electrode and the reference electrode to become great enough. German Patent Application DE 196 20 059 A1 and corresponding U.S. Pat. No. 5,880,538 disclose a capacitive proximity switch which is made such that it switches only when the capacitance between the response electrode and the reference electrode changes at a rate which is greater than a lower boundary value. If the capacitance between the response electrode and the reference electrode changes at a rate which is smaller than the lower boundary value, the proximity switch does not switch, not even when the capacitance between the response electrode and the reference electrode reaches a relatively great value.

In the circuit arrangement known from German Patent Application DE 196 20 059 A1 and U.S. Pat. No. 5,880,538 for unlocking at least one door lock of a motor vehicle with a dynamically operating capacitive proximity switch, the above described evaluation of the rate of the change of capacitance can suppress noise effects which lead to an essentially static change in capacitance.

However, in addition, dynamic noise effects can occur which then also lead to a dynamic change in capacitance so that, in the known circuit arrangement or in the known capacitive proximity switch, they do not lead to a switching signal only when the operating threshold of the capacitive proximity switch is correspondingly high.

In particular, for the application of a capacitive proximity switch described here by way of example, to unlock the door lock of a motor vehicle, however with respect to the speed of the capacitive proximity switch, the requirements are relatively high. The approach of the hand of an individual to the door handle is designed to cause unlocking of the door handle, to open the door as in the past the door handle having to be actuated. This results in the requirement that the door lock must already be unlocked before the user actuates the door handle. Moreover, since the door lock of a motor vehicle is not to be unlocked by just any individual who approaches the door handle with his hand, before unlocking the door lock, generally the access authorization of the user is checked. This can take place, for example, by means of the above described smart card system. The above described requirements yield the necessity of a lead time which is on the order of 100 ms for normal door locks.

So that both the access authorization of the user can be checked and also the door lock can be unlocked within this lead time, either very rapid data transmission of the authorization query and very prompt reversal of the door lock between the locked state and the unlocked state or very high sensitivity of the capacitive proximity switch is necessary. To achieve a high transmission rate of data communication and prompt reversal of the door lock, both a high-quality and thus expensive transmission system and also a high-quality door lock are necessary.

On the other hand, if the required lead time is relatively large since, for example, the unlocking mechanism of the door lock is relatively slow-acting, the capacitive proximity switch must be set to a very high sensitivity so that the required lead time can be maintained. However, this leads to changes in capacitance also being registered by the proximity switch which are caused by false objects. The false objects which cause unwanted dynamic changes in capacitance can be especially raindrops.

In the application of a capacitive proximity switch described here for locking and unlocking the door lock of a motor vehicle, this can lead to unacceptable consequences. When using the capacitive proximity switch in the locking system of a motor vehicle, the triggering of the authorization query by the identification receiver is associated with the switching process, i.e., with the presence of a corresponding switching signal, of the proximity switch. The activation of the identification receiver causes increased current consumption which loads the battery of the motor vehicle. When during a longer lasting rain, the capacitive proximity switch relatively often ascertains a change in capacitance which leads to a switching signal each time, the resulting frequent authorization query of the identification receiver can lead to undue discharge of the motor vehicle battery.

SUMMARY OF THE INVENTION

In view of the foregoing, a primary object of the present invention is to provide a capacitive proximity switch with reliable error detection or error suppression, the error suppression being designed not to lead to a general reduction of the sensitivity of the capacitive proximity switch. In the specific application, the object is especially to ensure reliable rain detection or rain suppression, and to make available a sufficient lead time due to the high sensitivity of the capacitive proximity switch.

The aforementioned object in the initially described capacitive proximity switch is achieved in that, in the evaluation unit, an evaluation of the measured value which corresponds to the change in capacitance over time takes place, that depending on the time behavior of the measured value, a second operating threshold is activated, the second operating threshold being reached only at a relatively great change in capacitance which is caused by a target object incoming or outgoing in the sensitive area of the proximity switch, while the first operating threshold is also reached at a smaller change in the capacitance which can also be caused by a false object incoming or outgoing in the sensitive area of the proximity switch, and that, in the "normal state" (the second operating threshold not activated), a switching signal is produced when the measured value has reached the first operating threshold, while when the second operating threshold has been activated, a switching signal is produced only when the measured value has reached the second operating threshold.

One important aspect of the capacitive proximity switch of the invention is the use of a second operating threshold for activation of the switching output, i.e., for producing the corresponding switching signal. For the described activation, this means that the second operating threshold is activated when rain is recognized by the capacitive proximity switch or by the evaluation unit, so that any small change in capacitance which has been measured by the capacitive proximity switch and which is caused by raindrops no longer leads to activation of the switching output, and thus, to an authorization query which is associated with increased current consumption by the identification receiver. The corresponding switching signal is at the switching output of the capacitive proximity switch only when the change in capacitance is so great that the measured value has reached the second operating threshold. In this way, frequent unwanted activation of the identification receiver and thus a discharge of the measured value battery during rain are prevented. The capacitive proximity switch of the invention thus has good noise suppression.

However, at the same time, the capacitive proximity switch also has high sensitivity since in the normal state, i.e., in the rain-free state, the first operating threshold $S_1$ is activated and thus the approach of a hand to the door handle is detected already relatively early due to the high sensitivity and leads to a switching signal. In this way, a relatively long lead time is ensured, within which both an authorization query and also unlocking of the door lock can reliably take place. Only when the capacitive proximity switch has detected a false object, in this case rain, does activation of the second operating threshold $S_2$ result in the hand approaching the door handle only somewhat later leading to a switching signal, by which the lead time is reduced. The resulting delayed unlocking of the door lock is a minor disruption in the ease of operation which, however, only occurs intermittently so that this minor disadvantage can be accepted.

As has been stated above, the second operating threshold $S_2$ is activated when the evaluation unit of the capacitive proximity switch detects a false object, in this case raindrops. The first step to successful noise suppression is thus reliable detection of noise sources or errors.

According to the invention, this detection of noise sources or errors takes place by evaluation of the measured value which corresponds to the change in capacitance over time. Here, it has been first recognized that there are differences between the time behavior of the change in capacitance which is produced by a target object—the approaching or retreating hand of the user, and the time behavior of the change in capacitance which is caused by a false object—a raindrop falling through the sensitive area of the proximity switch. These differences can be detected and evaluated by the time evaluation of the change in capacitance, and then accordingly, either the first operating threshold or the second operating threshold can be activated.

There are various possibilities with respect to the time evaluation of the measured value which corresponds to the change in capacitance. If the capacitive proximity switch registers a change in capacitance which produces a measured value which is larger than the first operating threshold, first the time behavior of the change in capacitance or of the measured value can continue to be monitored or stored for a certain time interval. Within this time interval, then as a result of the time behavior of the change in capacitance, a conclusion is possible regarding whether the change in capacitance has been caused by a target object or a false object.

One possible criterion for differentiating between the target object and the false object can be, for example, the occurrence of one or more local peaks or valleys in the time behavior of the measured value. When a hand approaches the door handle of a motor vehicle, a continuous increase of the capacitance takes place so that the signal characteristic of the measured value also behaves in a monotonic manner. In contrast, the signal characteristic of a change in capacitance which is caused by individual raindrops has one or more local peaks or valleys.

According to one advantageous embodiment, the capacitive proximity switch of the invention has a storage in which at least one typical signal characteristic of the change in capacitance or of the measured value is filed, so that the time evaluation of the measured value takes place using a comparison of the time behavior of the measured value with the stored signal characteristic. When using a correspondingly "intelligent" capacitive proximity switch, pattern recognition is possible so that different false objects can be detected and these false objects can be distinguished.

According to an especially preferred embodiment of the capacitive proximity switch in which reliable detection of noise sources or errors is accomplished in an especially simple manner, the evaluation unit has a counter, the counter detecting the number of changes in capacitance per time interval and a second, higher operating threshold being activated when the number of changes exceeds a first boundary value.

In this especially advantageous embodiment of the capacitive proximity switch, it has first been recognized that false objects often occur in intervals and with a certain regularity. With respect to the described application example, this means that, when raining, a certain number of raindrops fall through the sensitive area of the proximity switch per time interval. Some of these raindrops can be so large that they cause a change in capacitance which produces a measured value which is larger than the first operating threshold. These raindrops would thus produce a switching signal at the switching output of the capacitive proximity switch without the error detection in accordance with the invention. Because the evaluation unit has a counter which detects the number of changes in capacitance per time interval, by comparison of the counting rate which has been determined in this way with a suitably chosen boundary vale, the detection of rain is possible. If the number of changes exceeds the boundary value, this is interpreted as rain by the evaluation unit. This then leads—as already described above—to the second higher operating threshold being activated, preventing a switching signal from being produced continuously at the switching output by the individual raindrops. Only when the change in capacitance produces a measured value which exceeds the second operating threshold is this interpreted by the evaluation unit as the approach of a hand and a corresponding switching signal is produced at the switching output.

Advantageously, when the switching signal at the switching output is determined by the second operating threshold, the measured value is also always compared to the first operating threshold. This ensures that, even with the second operating threshold activated, it is continuously checked whether the false objects detected beforehand are present as before, i.e., whether it is still raining. Since during activation of the second operating threshold, the sensitivity of the capacitive proximity switch is reduced, it is desirable to return again to the first operating threshold as quickly as possible when the rain ends in order to be able to use the desired high sensitivity of the proximity switch. Therefore, advantageously with the second operating threshold activated, then the first operating threshold is again activated when the number of changes in capacitance per time interval falls below a boundary value.

Since, in the preferred version of the capacitive proximity switch, a change in capacitance is compared simultaneously to at least two operating thresholds in the described embodiment, both the start of the rain and the end of the rain are detected. Here, for noise source or error detection the first lower operating threshold is always active, and for the switching output, optionally, the second higher operating threshold is activated. The actual sensitivity of the capacitive proximity switch is thus not changed; it is determined by the operating threshold.

More advantageously, the switching between the different operating thresholds is provided with hysteresis. This can be easily accomplished by a corresponding choice of boundary values with one boundary value being chosen to be distinctly higher than the other boundary value. For the choice of a higher boundary value which is at least twice, preferably four to five times higher than the other boundary value, the result is that after detection of rain, switching back to the first operating threshold again does not take place quickly, since otherwise overly frequent activation of the switching output could occur, caused by the number of raindrops prevailing as before, even if smaller.

The choice of the boundary values not only allows setting of the hysteresis, but moreover also matching of the capacitive proximity switch to the respective application. This optimized matching to the respective application is preferably also achieved by the time interval during which the number of changes in capacitance is detected by the counter being smaller than the time interval during which the number of changes in capacitance is detected by the counter when the second operating threshold has been activated. This results in that when rain occurs the second operating threshold is activated relatively quickly, by which overly strong discharge of the vehicle battery is prevented. As was stated initially, when using the capacitive proximity switch to unlock the door handle of a motor vehicle, the frequent activation of the identification receiver caused by individual raindrops as a result of the associated discharge of the measured value battery is a more critical state, while the reduced ease of operation which is associated with the delayed unlocking of the door lock is relatively noncritical. Therefore, by choosing a longer time interval the decision-making time interval can be prolonged for more reliably ascertaining the end of rain.

As already stated above, the boundary values and the time intervals can be adjusted for improved matching to the respective application. There is preferably also a corresponding setting for the operating thresholds. The individual values can be set either by the user or it takes place automatically by the evaluation unit of the capacitive proximity switch in any case within certain limits.

Here, there can be a learning phase, within which as a result of the time evaluation of the change in capacitance or of the measured value by the evaluation unit or by a microprocessor which belongs to the evaluation unit, the operating thresholds, the boundary values and/or the time intervals can be set. The capacitive proximity switch can be trained to the typical user behavior of the authorized individual during this learning phase. In this way, it is possible to deny unauthorized individuals in possession of the ID sender access to the motor vehicle. Thus, for example, access to the motor vehicle can be blocked for small children who do not cause the user-typical changes in capacitance, even if the children come into possession of the ID sender by chance or inattentiveness of their parents.

According to another advantageous embodiment of the capacitive proximity switch of the invention which will only be briefly mentioned here, the setpoint capacitance is dynamically corrected to the measured actual capacitance so that a known drift correction is accomplished. The drift correction is relatively slow compared to the change in capacitance which occurs due to the target object or the false objects. The change of the actual capacitance which is taken into account by the drift correction is based, for example, on temperature changes or deposits on the door handle, by which the actual capacitance is influenced. In measurement engineering terms, the setpoint capacitance is not directly changed, but the operating thresholds are adjusted; this leads to the same change in capacitance being necessary to produce a switching signal for a change of the actual capacitance which has been caused by a temperature change.

In addition to the relatively slow dynamic correction of the setpoint capacitance or of the operating thresholds, in addition the rate of the change in capacitance can also be detected and compared to one or more boundary rates which have been filed in the storage, in which at a change in capacitance which produces a measured value which is greater than the activated operating threshold only then is the switching output activated when the rate of the measured change in capacitance is greater than the lower boundary rate and/or less than the upper boundary rate. In this way, the danger of unwanted activation of the switching output of the capacitive proximity switch can be further minimized. The lower and upper boundary rates can be set, for example, by choosing a minimum and maximum speed for a typical hand movement. The lower and upper boundary rate can also be indirectly set by defining several operating thresholds which are corrected at different speeds to the measured value. Rapid control leads to the operating threshold being reached only at correspondingly rapid changes in capacitance.

Evaluation of the rate of change in capacitance in addition to evaluation of the change in capacitance, moreover, allows establishment of certain operating rules, for example, for security-relevant applications. This means that a certain switching process can only be intentionally triggered, not accidentally or carelessly. In the extreme case, this can be achieved by satisfying a certain code which, for example, recognizes a sequence of approaches of the hand to the door handle at different speeds as access authorization. In a capacitive proximity switch built in this way, then the use of a smart card system would not be critically necessary.

Another application of evaluation of the rate of change in capacitance is the implementation of lead time stabilization. Rapid hand movements of a user at the same sensitivity of the capacitive proximity switch lead to shorter lead times than slow hand movements, since detection depends on the distance of the hand from the response electrode. By corresponding control of the sensitivity of the capacitive proximity switch, i.e., of the first operating threshold, depending on the set or measured rate of change in capacitance the required lead time can be set. For a user who must move his hand relatively quickly towards the door handle an operating threshold must thus be chosen which is smaller than for a user who is reaching relatively slowly for the door handle with his hand.

In some applications, moreover, it can be a good idea or advantageous to provide more than two operating thresholds. By increasing the number of operating thresholds the resolution of the detected change in capacitance can be increased. The increased resolution, for example, makes it possible to detect and optionally assign different target objects.

Even if the capacitive proximity switch in accordance with the invention is suited for different applications, it can be especially advantageously used in the door handle of a motor vehicle for locking or unlocking the door lock. Therefore, this invention also relates to a circuit arrangement for unlocking at least one door lock of a motor vehicle, with an electronic activation circuit and with a capacitive proximity switch according to the invention, the response electrode of the capacitive proximity switch being integrated in the door handle. This circuit arrangement is characterized by the unlocking or the locking of the door lock taking place only when the hand of an individual entering or leaving the sensitive area of the proximity switch causes a change in capacitance which produces a measured value which is greater than the activated operating threshold, so that there is a switching signal at the switching output of the capacitive proximity switch, and if triggered by the switching signal of the capacitive proximity switch, the individual has been recognized as an authorized individual by the electronic activation circuit.

The electronic activation circuit described here can be especially the initially described smart card system. Preferably, in the above described switching system, different values are assigned to the operating thresholds and/or the boundary values and/or to the time intervals and/or to the boundary rates depending on whether the door lock is locked or unlocked. The fact that the lead time is critical only when the door lock is being unlocked is taken into account since, when the door lock is being locked, generally there is no activation of the door handle.

According to the last advantageous embodiment of the circuit arrangement, there is a second sensor, especially a second capacitive proximity switch, which acts as a rain sensor and preferably, moreover, also delivers the switching signal for locking the door lock, while the first capacitive proximity switch delivers only the switching signal for unlocking the door lock. As already stated above, the lead time when the door lock is being locked is not critical so that, for this reason, lesser demands can be imposed on the sensor. In particular, the time interval for the second sensor can be chosen to be much longer by which, at the same time, a reliable conclusion about the presence of rain can be drawn.

In particular, there is now a host of possibilities for embodying and developing the capacitive proximity switch of the invention. For this purpose, reference is made to the following detailed description of embodiments in conjunction with the accompanying drawings.

DETAILED DESCRIPTION OF THE INVENTION

Figure 1:
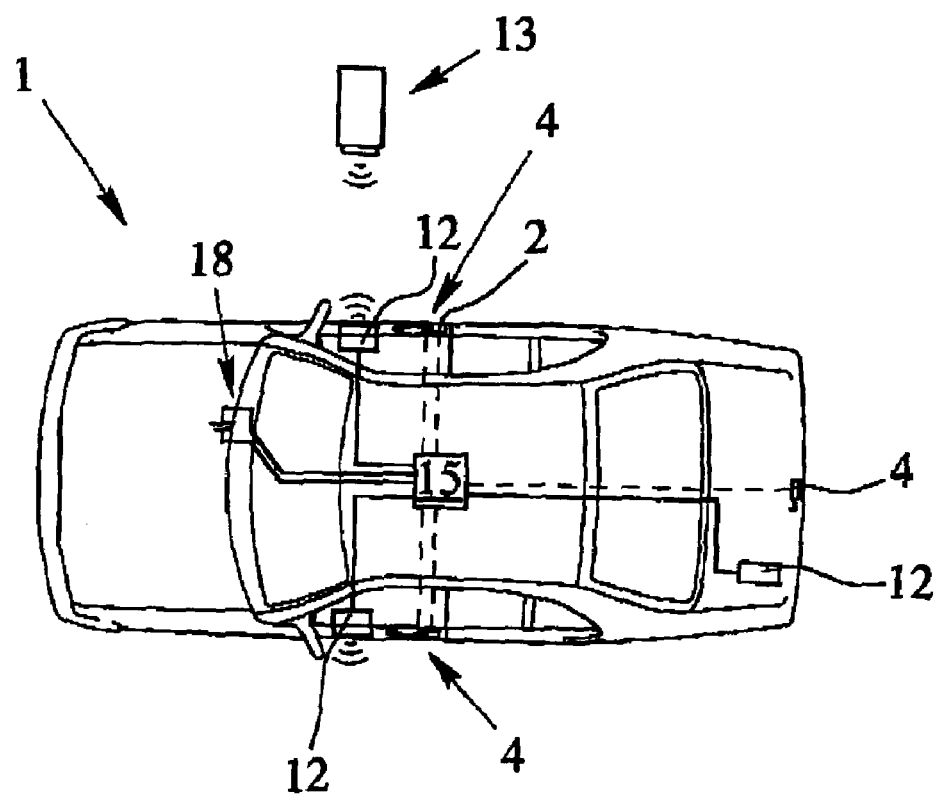
FIG. 1 is a schematic plan view of a motor vehicle with the circuit arrangement as in accordance with the invention.
Figure 2:
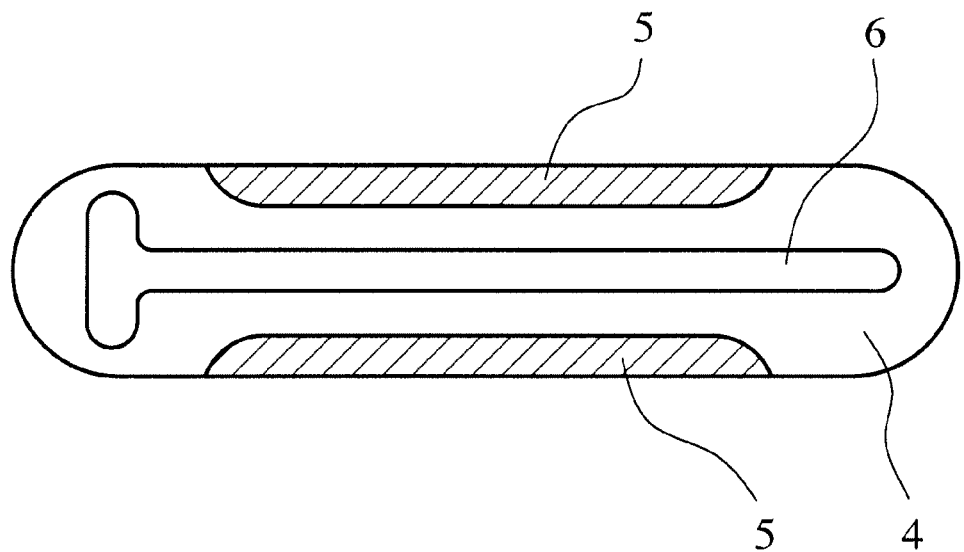
FIG. 2 shows the interior of the door handle of a motor vehicle as seen from the door toward the handle.

FIGS. 1 & 2, together, schematically show a motor vehicle 1 which has a circuit arrangement for locking and unlocking at least one door lock 2 with an electronic activation circuit and with a capacitive proximity switch 3, a response electrode 5 and a compensation electrode 6 of the proximity switch 3 being integrated in the door handle 4. The compensation electrode 6 is shown only in FIG. 2, and not in the simplified circuit diagram of the proximity switch 3 in FIG. 3. How a possible circuit diagram of a proximity switch 3 which, in addition to the response electrode 5, also has a compensation electrode 6 can look can be taken from FIG. 3 of U.S. Pat. No. 5,880,538.

As follows from the block diagram of the circuit arrangement shown in FIG. 3, the capacitive proximity switch 3 includes, besides the electrode system which has the response electrode 5, an evaluation unit 7 with a comparator 8 which has an operating threshold $S_1$, and a switching output 9. At the input 10 of the comparator 8 (FIG. 5), there is a voltage $U_{meas}$, while at the other input 11 of the comparator 8, there is a reference voltage $U_{ref}$ which corresponds to the selected operating threshold.

If the value which has been measured by the capacitive proximity switch 3 and which corresponds to the change in capacitance $\Delta C$ has reached the operating threshold, the corresponding switching signal is at the switching output 9. The switching signal then triggers the identification receiver 12 of the electronic activation circuit so that, proceeding from the identification receiver 12, an authorization query is sent to the identification sender 13. If the individual whose hand 14 is approaching the door handle 4 possesses the correct identification sender 13, by sending back a corresponding recognition signal to the identification receiver 12, the individual is identified as the "authorized" individual. Via a control unit 15 which is located in the motor vehicle 1, then unlocking of the door lock 2 is controlled, the lead time between detection of the hand 14 approaching the door handle 4 and the actuation of the door handle 4 based on the high sensitivity of the proximity switch 3 being sufficient that both the authorization query and also unlocking of the door lock 2 are completed before the individual actuates the door handle 4 to open the door.

Figure 3:
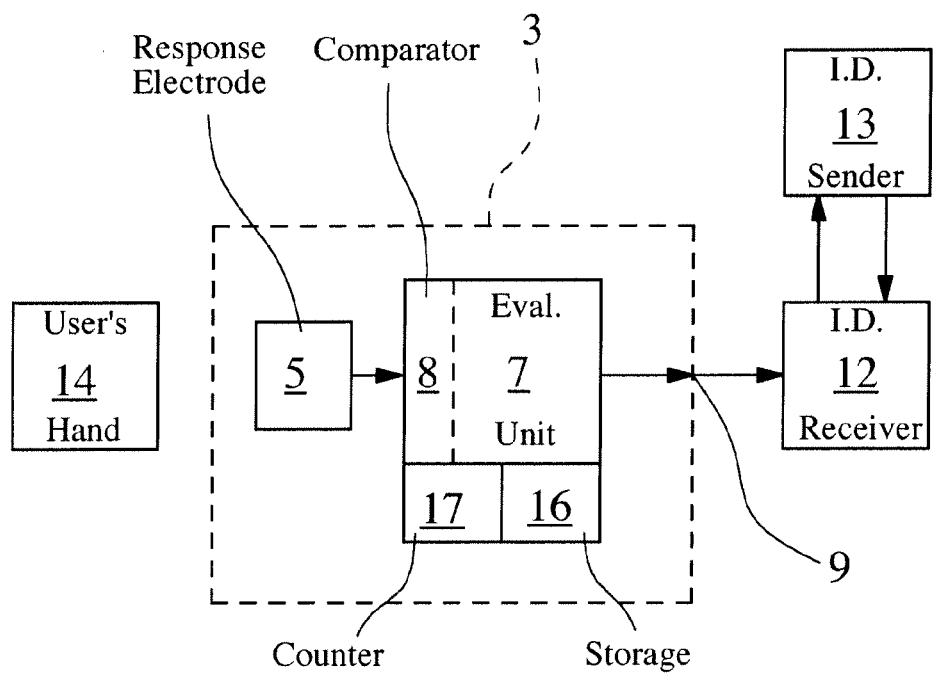
FIG. 3 is a block diagram of the circuit arrangement of the invention.

As is shown schematically in FIG. 3, the evaluation unit 7, which can be made overall as a microcontroller, has a storage 16 and a counter 17. In the counter 17, the number N of changes in capacitance $\Delta C_1$ per time interval $T_1$ which is greater than the first operating threshold $S_1$ is detected. If the number N exceeds a given boundary value $G_1$, this is interpreted by the evaluation unit 7 as the presence of rain, and to suppress the switching signal that would otherwise be caused by rain at the switching output 9, a second operating threshold $S_2$ is activated by the evaluation unit 7. The second operating threshold $S_2$ can be accomplished, for example, by providing a second comparator with a reference voltage which corresponds to the operating threshold $S_2$ at its second input, or, with only one comparator 8, the first operating threshold $S_1$ and the second operating threshold $S_2$ being applied in alternation to the second input 11 of the comparator. What is decisive is simply that the measured change in capacitance $\Delta C_1$ is compared to the two operating threshold $S_1$, $S_2$.

Figure 4:
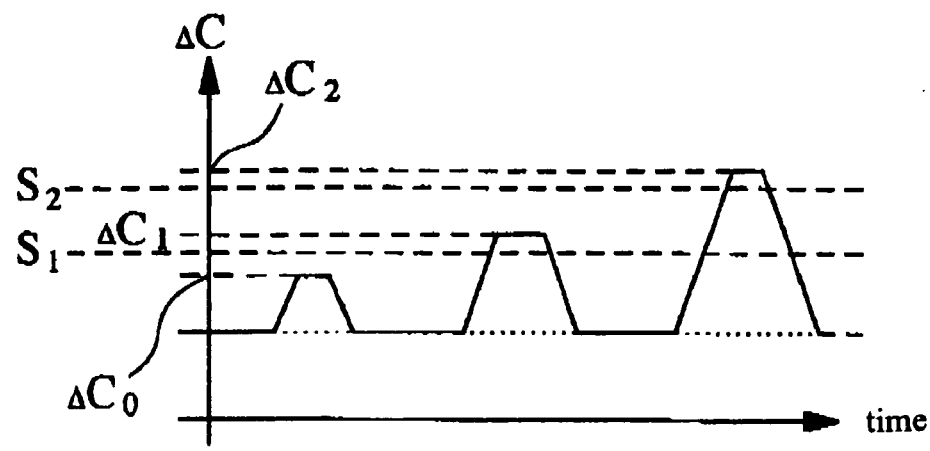
FIG. 4 is a graph representing the rate of the change in capacitance for different objects.

As follows from the time diagram of the change in capacitance $\Delta C$ relative to a setpoint capacitance $C_{set}$ which is shown in FIG. 4, the amount of the change in capacitance $\Delta C$ depends on the object which is located within the sensitive area of the proximity switch 3. In FIG. 4, three changes in capacitance $\Delta C$ which are caused by a very small, medium and a relatively large object are plotted with $\Delta C_0$, $\Delta C_1$, and $\Delta C_2$. The change in capacitance $\Delta C_0$ caused by a very small object is thus smaller than the first operating threshold $S_1$ so that this object is intentionally not registered by the capacitive proximity switch 3. An object this small as a false object thus does not lead to a switching signal at the switching output 9 of the capacitive proximity switch 3.

The change in capacitance $\Delta C_1$ caused by the medium object is larger than the lower operating threshold $S_1$ so that this object, for example, one or more raindrops falling through the sensitive area of the proximity switch 3, is detected by the capacitive proximity switch 3 and produces a switching signal at the switching output 9. Because at this point, in accordance with the invention, when rain is detected, the second higher operating threshold $S_2$ is activated, which is higher than the change in capacitance $\Delta C_1$. Thus, the change in capacitance $\Delta C_1$ detected by the capacitive proximity switch 3 does not lead to a switching signal at the switching output 9 of the proximity switch 3. Only when a large object—the hand of a user—enters the sensitive area of the proximity switch 3, is a change in capacitance $\Delta C_2$ caused thereby which is larger than the second operating threshold $S_2$. This change in capacitance $\Delta C_2$ then leads to a switching signal at the switching output 9 of the proximity switch 3; this leads to activation of the identification receiver 12 and thus to an authorization query in the circuit arrangement shown in FIG. 1.

The activation of the second, higher operating threshold $S_2$, which can be selected depending on noise detection for activation of the switching output 9 thus prevents very frequent activation of the identification receiver 12 in rain, which could lead to discharge of the vehicle battery 18.

Figure 5:
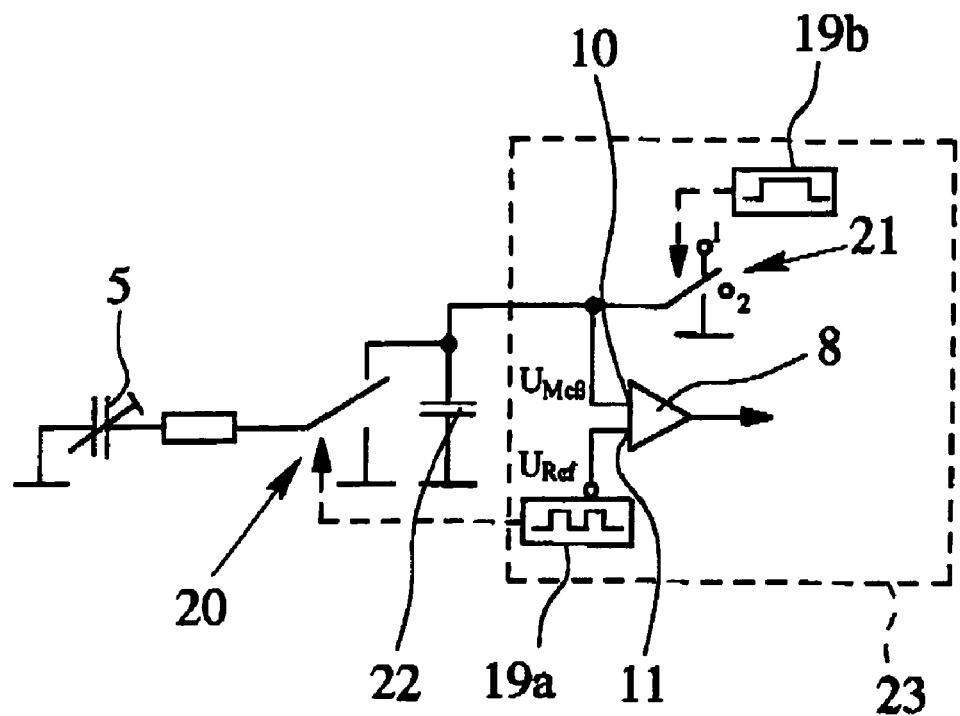
FIG. 5 is a simplified circuit diagram of a preferred embodiment of the capacitive proximity switch of the invention.

The simplified circuit diagram of the capacitive proximity switch 3 which is shown in FIG. 5 includes, the response electrode 5, two clock generators 19a, 19b and two changeover contacts 20, 21 which are controlled by the clock generators 19a, 19b. The frequency $f_1$ of the clock generator 19a is much higher than the frequency $f_2$ of the clock generator 19b. For example, the frequency $f_1=200$ kHz, while the frequency $f_2=33$ Hz. The capacitance $C_x$ to be measured is active between the response electrode 5 and the hand 14 of the user, i.e., the frame potential. The response electrode 5 is connected via a coupling resistor to the input of the first changeover contact 20. The illustrated capacitive proximity switch 3, furthermore, includes a reference capacitor 22 which can be connected by a first of its electrodes via the first changeover contact to the response electrode 4 and by the second of its electrodes to the reference potential (frame potential). With this switching, clocked discharge of the reference capacitor 22, which is parallel to the capacitance $C_x$ to be measured to a reference voltage $U_{ref}$, is possible. The evaluation unit 7, the comparator 8, the clock generators 19a, 19b, and the changeover contacts 20, 21 can be part of a microprocessor 23.

After the reference capacitor 22 has been charged to a fixed value, the changeover contact 21 is moved from a first position into a second position, and then, the capacitance $C_x$ to be measured is connected in alternation via the changeover contact 20 to the reference capacitor 22 and the reference potential (frame potential). If the response electrode 5 is connected to the reference capacitor 22, the desired capacitance $C_x$ is charged, the transported charge Q being proportional to the capacitance $C_x$. Then, the capacitance $C_x$ which is to be measured is connected via the changeover contact 20 to the reference potential and thus discharged, before a new charging process begins. The known charge $Q_{ref}$, which at the start of measurement is in the reference capacitor 22, is thus transported in batches to the reference potential by means of the desired capacitance $C_x$. The number n of clock pulses necessary for discharge is a measure of the desired capacitance. The greater the desired capacitance $C_x$, the fewer clock pulses are necessary for discharge of the reference capacitor 22. If the reference voltage $U_{ref}$ is reached at the input 10 of the comparator 8, the counting process is ended. The measured value then corresponds to the number n which has been reached.

Figure 6:
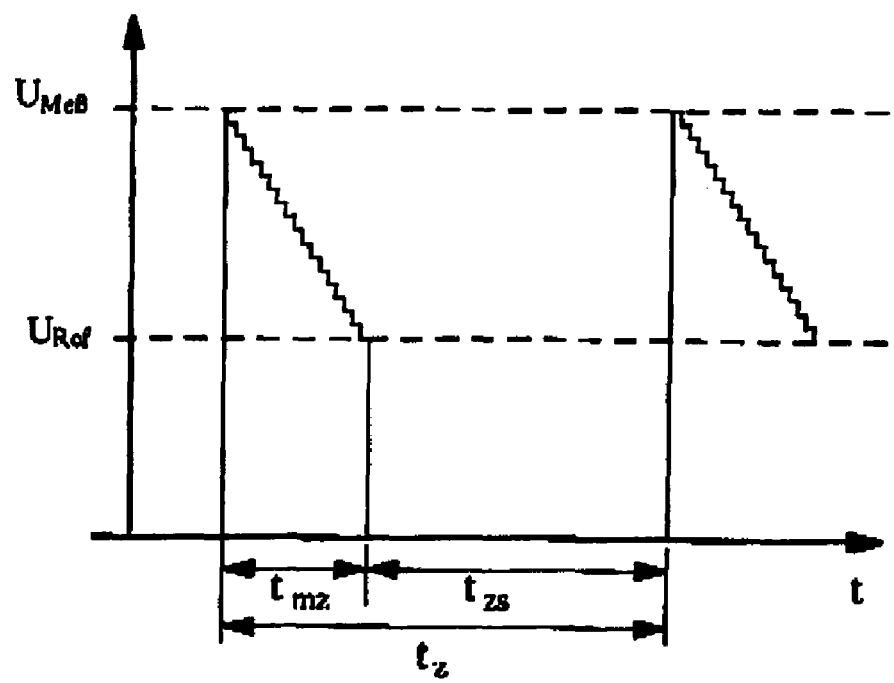
FIG. 6 is a graph representing the rate of the change in capacitance for the capacitive proximity switch shown in FIG. 4.

FIG. 6 shows a representation of the measurement of the change in capacitance $\Delta C$ in the capacitive proximity switch 3 which has the a circuit diagram shown in FIG. 5. As already stated, as the measured value for the desired change in capacitance $\Delta C$, the number n of clock pulses necessary for discharge, i.e., the recharging processes, is counted which is necessary until the measured voltage $U_{meas}$ at the input 10 of the comparator 8 corresponds to the reference voltage $U_{ref}$. The number n decreases as the object approaches the response electrode 5. Alternatively, to measurement of the number n, the time t which passes until the reference voltage $U_{ref}$ is reached can also be measured. The measured value—the number n or the time t—is thus an integration value which is proportional to the desired change in capacitance $\Delta C$.

Moreover, FIG. 6 shows that the individual measurement cycles take place intermittently with a cycle time $t_{MZ}$. The cycle time $t_{MZ}$ of a measurement cycle is thus shorter than the total cycle time $t_Z$. To reduce the power consumption of the capacitive proximity switch 3, the microprocessor 23 is shifted into the sleep mode during the time interval $t_{ZS}$. The ratio of the cycle time $t_{MZ}$ to the time interval $t_{ZS}$ is between 1:2 to 1:8. For a total cycle time $t_Z$=30 ms, the cycle time $t_{MZ}$ is, for example, 10 ms.

Figure 7:
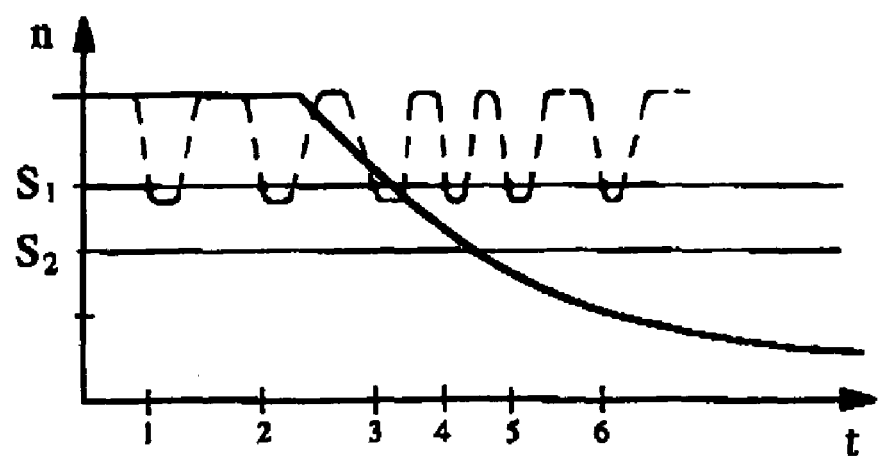
FIG. 7 is a graph representing the rate of change the measured values for a false object and when a hand approaches.

FIG. 7 shows a time diagram for representation of measured values for a false object and when a hand approaches. Here, as the measured value for the desired change in capacitance $\Delta C$, the number n of the clock pulses necessary for discharge is also being counted. In the unattenuated state, i.e., when an object has not approached the response electrode 5 closely enough, this number n is, for example, 2500. When the object approaches, the capacitance increases, by which the number n is reduced. The first operating threshold $S_1$ at which there is a change in capacitance $\Delta C_1$ is, for example, n=2450. The second operating threshold $S_2$ which is reached at a change in capacitance $\Delta C_2$ is, for example, n=2300. While the change in capacitance $\Delta C_2$ is greater than the change in capacitance $\Delta C_1$, the second operating threshold $S_2$ is smaller than the first operating threshold $S_1$. Whether the first operating threshold $S_1$ or the second operating threshold $S_2$ is greater, thus depends on which quantity is used as the measured value for the change in capacitance $\Delta C$.

The line which is solid in FIG. 7 shows the measured value of an approaching hand 14, while the broken line represents the measured value of rain. Due to the host of raindrops which influence the capacitive proximity switch 3, within a certain time interval $T_1$, the number N of the changes in capacitance $\Delta C_1$ is detected, while for an approaching hand 14, only one change in capacitance $\Delta C$ is detected. For a number N which is larger than the lower boundary value $G_1$, then rain is detected by the evaluation unit and the second operating threshold $S_2$ is activated.

Moreover, it can be taken from FIG. 7 that differentiation between an approaching hand 14 and raindrops can also take place by the occurrence of one or more local valleys in the time behavior of the measured value. When a hand 14 approaches the door handle 4 of a motor vehicle 1 a continuous increase in the capacitance C takes place so that the signal characteristic of the measured value is monotonically falling when the number n is evaluated. In contrast, the characteristic of the measured value which is caused by the rain has several local valleys.

Figure 8:
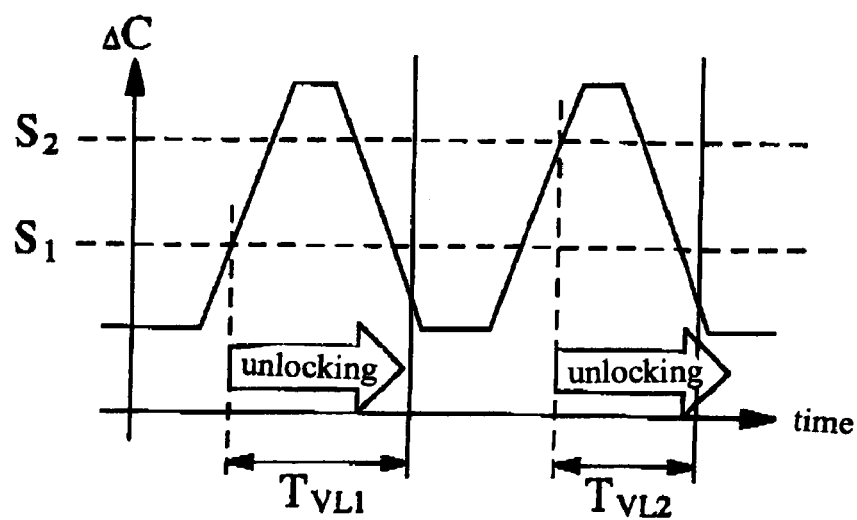
FIG. 8 is a graph representing the rate of the change in capacitance for showing the lead time as a function of the operating threshold.

The time diagram of the changes in capacitance $\Delta C$ shown in FIG. 8 indicates that, for an activated first operating threshold $S_1$, a longer lead time $T_{VL1}$ is available than when the second higher threshold $S_2$ is activated. Activation of the second threshold $S_2$ reduces the lead time $T_{VL2}$ so that, under certain circumstances, it can occur that the door lock 2 is not completely unlocked when the hand 14 of the authorized user has already reached the door handle 4. This limitation which occurs under certain circumstances with respect to user comfort can, however, be easily accepted compared to the disadvantages of overly frequent activation of the identification receiver 12.

So that the lead time $T_{VL}$ is not unnecessarily shortened, detection of the end of rain is possible by the capacitive proximity switch 3 of the invention. This is achieved in that the measured value is always compared to the operating threshold $S_1$ when the operating threshold $S_2$ has been activated.

Figure 9:
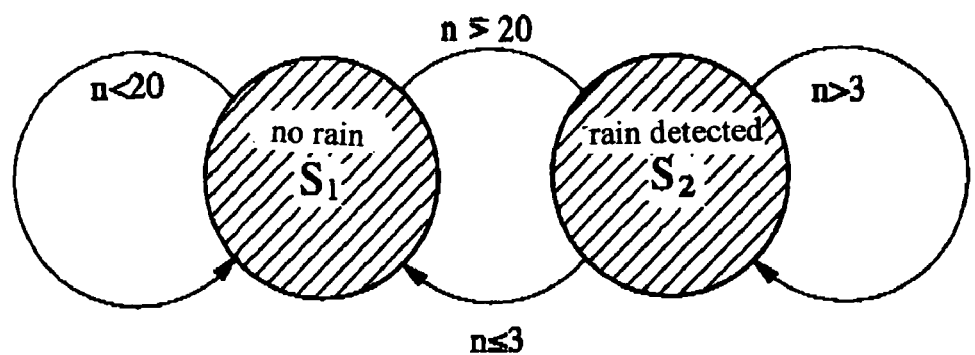
FIG. 9 is a flow chart of the switching between the two operating thresholds.

The detection of rain which is preferably accomplished in the capacitive proximity switch 3 and the hysteresis which is accomplished when switching between the two operating thresholds $S_1$ and $S_2$ are explained below using the flow chart shown in FIG. 9.

For example, the time interval $T_1$ within which the number N of changes in capacitance $\Delta C_1$ which are greater than the operating threshold $S_1$ is detected has been assumed to be two minutes. But of course, a shorter or longer time interval $T_1$, preferably between 30 seconds and 3 minutes, can also be set. If the number N of changes in capacitance $\Delta C_1$ which are registered within two minutes is greater than 20, this is interpreted as rain by the evaluation unit 7, whereupon the second operating threshold $S_2$ is then activated as the operating threshold which is relevant to the switching output 9. As long as the number N of changes in capacitance $\Delta C_1$ within two minutes is greater than three, the second operating threshold $S_2$ remains activated for the switching output 9. Conversely, if the number N is no longer greater than three, this is interpreted as the end of rain by the evaluation unit 7 and the first operating threshold $S_1$ is again activated as the operating threshold which is relevant to the switching output 9. If the number N then increases again to twenty, this is interpreted again as rain by the evaluation unit 7 and the second operating threshold $S_2$ is re-activated accordingly.

Figure 10:
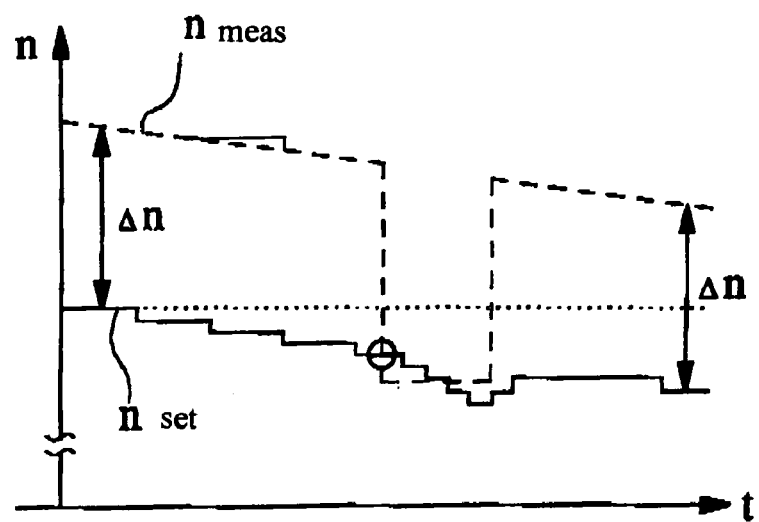
FIG. 10 is a graph representing drift correction.

Finally, FIG. 10 shows a representation of the drift correction, the operating threshold being corrected when the actual capacitance $C_{act}$ changes. This leads to the fact that, when a change of the actual capacitance $C_{act}$ is caused by a temperature change, the same change in capacitance $\Delta C$ and the same number change $\Delta n$ are also necessary in order to produce a switching signal. The relatively slow change of the actual capacitance $C_{act}$ is not caused here by the entry of objects into the sensitive area of the proximity switch 3, but as a result of other changing ambient conditions. The change of the operating threshold undertaken here is thus much less than the required number change $\Delta n_1$ for producing the switching signal. If the first operating threshold $S_1$ at which the change in capacitance $\Delta C_1$ is present is for example $n_1$=2450 and the number change $\Delta n_1$=50, a drift correction on the order of $\Delta n_{Drift}$=5–10 takes place.

What is claimed is:

1. Capacitive proximity switch for detecting a change in a capacitance $\Delta C$ relative to a setpoint capacitance $C_{set}$ by the approach or retreat of an object in a sensitive area of the proximity switch having an electrode system with at least, one response electrode, an evaluation unit and a switching output, a measured value which corresponds to the change in capacitance being compared to a operating threshold and a switching signal being produced at the switching output depending on the measured value, wherein:

the evaluation unit is adapted to produce an evaluation of the measured value which corresponds to the change in capacitance $\Delta C$ over time, and based on the time behavior of the measured value, the evaluation unit is adapted to deactivate a first operating threshold $S_1$ and to activate a second operating threshold $S_2$, the second operating threshold $S_2$ which is reached only at a change in capacitance $\Delta C_2$ which is caused by a target object coming into or out of the sensitive area of the proximity switch with is greater than the first operating threshold $S_1$, which is reached at a smaller change in the capacitance $\Delta C_1$ which can be caused by a false object coming into or out of the sensitive area of the proximity switch, and wherein the operating threshold $S_1$ is a default operating threshold for producing the switching signal when the measured value has been reached, while the second operating threshold $S_2$ is activated for producing the switching signal only when the measured value has reached the second operating threshold $S_2$.

2. Capacitive proximity switch as claimed in claim 1, wherein the evaluation unit has a storage and after reaching the first operating threshold $S_1$, the measured value is continuously determined and stored for a predetermined time interval.

3. Capacitive proximity switch as claimed in claim 2, wherein the evaluation unit is adapted to perform a time evaluation of the measured value by comparison of the time behavior of the measured value relative to signal characteristics stored in the storage.

4. Capacitive proximity switch as claimed in claim 1, wherein the evaluation unit has a counter, the counter being adapted to detect the number N of changes in capacitance $\Delta C_1$ per time a interval $T_1$ and the evaluation unit being adapted to activate the second operating threshold $S_2$ when the number N exceeds a boundary value $G_1$.

5. Capacitive proximity switch as claimed in claim 1, wherein when the operating threshold $S_2$ is in an activated state, the evaluation unit is also operative for comparing the measured value to the operating threshold $S_1$.

6. Capacitive proximity switch as claimed in claim 4, wherein when the operating threshold $S_2$ is in an activated state, the evaluation unit is also operative for comparing the measured value to the operating threshold $S_1$; and wherein when the second operating threshold $S_2$ is in an activated state, the first operating threshold $S_1$ is re-activated when the number N of changes in capacitance $\Delta C_1$ per time a interval $T_2$ falls below a boundary value $G_2$.

7. Capacitive proximity switch as claimed in claim 6, wherein a hysteresis effect is provided for switching between the two operating thresholds $S_1$, $S_2$ by a corresponding choice of the boundary values $G_1$, $G_2$.

8. Capacitive proximity switch as claimed in claim 6, wherein the time interval $T_1$ is smaller than the time interval $T_1$.

9. Capacitive proximity switch as claimed in claim 6, wherein at least one of the operating thresholds $S_1$, $S_2$, the boundary values $G_1$, $G_2$ and the time intervals $T_1$, $T_2$ are settable.

10. Capacitive proximity switch as claimed in claim 1, wherein there are more than two operating thresholds.

11. Capacitive proximity switch as claimed in claim 6, wherein there are more than two operating thresholds and more than two time intervals.

12. Capacitive proximity switch as claimed in claim 1, wherein the evaluation unit is adapted to implement a drift correction by which the operating thresholds $S_1$, $S_2$ are dynamically corrected when the measured actual capacitance $C_{act}$ changes.

13. Capacitive proximity switch as claimed in claim 1, wherein the evaluation unit is adapted to measure a rate of change of capacitance $\Delta C/\Delta t$ and to suppress changes in capacitance $\Delta C$ which have a rate smaller than a lower boundary rate $v_1$.

14. Capacitive proximity switch as claimed in claim 13, wherein the evaluation unit is provided with a in which at least two boundary rates $v_1$, $v_2$ are stored and wherein the evaluation unit is adapted to produce activation of the switching output only when the rate of the measured change in capacitance $\Delta C/\Delta t$ is greater than at least one the lower boundary rate $v_1$ and the upper boundary rate $v_2$ when a measured change in capacitance $\Delta C$ is greater than the operating threshold.

15. Capacitive proximity switch as claimed in claim 6, wherein the evaluation unit has a learning phase during which at least one of the operating thresholds $S_1$, $S_2$, the boundary values $G_1$, $G_2$, the time intervals $T_1$, $T_2$ and the boundary rate $v_1$, $v_2$ are set based upon results of the time evaluation of the change in capacitance $\Delta C$ or of the measured value.

16. Circuit arrangement for locking or unlocking at least one door lock of a motor vehicle with an electronic activation circuit and with a capacitive proximity switch for detecting a change in a capacitance $\Delta C$ relative to a setpoint capacitance $C_{set}$ by the approach or retreat of an object in a sensitive area of the proximity switch having an electrode system with at least one response electrode, an evaluation unit and a switching output, a measured value which corresponds to the change in capacitance being compared to a operating threshold and a switching signal being produced at the switching output depending on the measured value, wherein the evaluation unit is adapted to produce an evaluation of the measured value which corresponds to the change in capacitance $\Delta C$ over time, and based on the time behavior of the measured value, the evaluation unit is adapted to deactivate a first operating threshold $S_1$ and to activate a second operating threshold $S_2$, the second operating threshold $S_2$ which is reached only at a change in capacitance $\Delta C_2$ which is caused by a target object coming into or out of the sensitive area of the proximity switch with is greater than the first operating threshold $S_1$, which is reached at a smaller change in the capacitance $\Delta C_1$ which can be caused by a false object coming into or out of the sensitive area of the proximity switch, wherein the operating threshold $S_1$ is a default operating threshold for producing the switching signal when the measured value has been reached, while the second operating threshold $S_2$ is activated for producing the switching signal only when the measured value has reached the second operating threshold $S_2$, wherein a response electrode of the capacitive proximity switching arrangement is integrated in a door handle, wherein unlocking or locking of the door lock only takes place when a change in capacitance $\Delta C$ is caused by the hand of an individual, which hand is entering or leaving a sensitive area of the proximity switch, which change in capacitance produces a measured value which is greater than the activated operating threshold $S_1$, $S_2$ so that, at the operating output of the capacitive proximity switch there is a switching signal, and when triggered by the switching signal of the capacitive proximity switch, the individual has been recognized as the authorized individual by the electronic activation circuit.

17. Circuit arrangement as claimed in claim 16, wherein the evaluation unit has a counter, the counter being adapted to detect the number N of changes in capacitance $\Delta C_1$ per time a interval $T_1$ and the evaluation unit being adapted to activate the second operating threshold $S_2$ when the number N exceeds a boundary value $G_1$; wherein when the operating threshold $S_2$ is in an activated state, the evaluation unit is also operative for comparing the measured value to the operating threshold $S_1$; wherein when the second operating threshold $S_2$ is in an activated state, the first operating threshold $S_1$ is re-activated when the number N of changes in capacitance $\Delta C_1$ per time a interval $T_2$ falls below a boundary value $G_2$; and wherein different values are assigned to at least one the operating thresholds $S_1$, $S_2$, the boundary values $G_1$, $G_2$, the time intervals $T_1$, $T_2$, and the boundary rates $v_1$, $v_2$ depending on whether the door lock is locked or unlocked.

18. Circuit as claimed in claim 16, wherein said capacitive proximity switch is a first capacitive proximity switch and a second capacitive proximity switch is provided which acts as a rain sensor and is operative for producing a switching signal for locking the door lock while the first capacitive proximity switch is operative for producing only the switching signal for unlocking the door lock.

* * * * *